United States Patent
Zhu et al.

(10) Patent No.: US 9,843,182 B2
(45) Date of Patent: Dec. 12, 2017

(54) SYSTEMS AND METHODS FOR USE IN IDENTIFYING AND RESPONDING TO TYPE OF GRID FAULT EVENT

(75) Inventors: Huibin Zhu, Westford, MA (US); David Smith, Daleville, VA (US); Maozhong Gong, Shanghai (CN); Xeuqin Wu, Shanghai (CN)

(73) Assignee: General Electric Company, Schenectady, NY (US)

( * ) Notice: Subject to any disclaimer, the term of this patent is extended or adjusted under 35 U.S.C. 154(b) by 744 days.

(21) Appl. No.: 14/354,336

(22) PCT Filed: Oct. 28, 2011

(86) PCT No.: PCT/CN2011/081499
§ 371 (c)(1),
(2), (4) Date: Apr. 25, 2014

(87) PCT Pub. No.: WO2013/060019
PCT Pub. Date: May 2, 2013

(65) Prior Publication Data
US 2014/0293489 A1     Oct. 2, 2014

(51) Int. Cl.
*H02H 7/10*     (2006.01)
*H02J 3/28*     (2006.01)
(Continued)

(52) U.S. Cl.
CPC ............ *H02H 7/10* (2013.01); *G01R 31/024* (2013.01); *H02J 3/28* (2013.01); *H02J 3/383* (2013.01);
(Continued)

(58) Field of Classification Search
USPC ......................................................... 361/18
See application file for complete search history.

(56) References Cited

U.S. PATENT DOCUMENTS 6,380,719 B2   4/2002   Underwood et al.
7,016,793 B2   3/2006   Ye et al.
(Continued)

FOREIGN PATENT DOCUMENTS

JP          08149843          6/1996

OTHER PUBLICATIONS

International Search Report, Application No. PCT/CN2011/081499, dated Aug. 9, 2012, pp. 13.
(Continued)

*Primary Examiner* — Zeev V Kitov
(74) *Attorney, Agent, or Firm* — James McGinness, Esq.; Armstrong Teasdale LLP

(57) ABSTRACT

Systems (100), power modules (108), and methods for using in controlling a converter (110) coupled between a power generator (104) and an electric grid (102). A power module (108) includes the converter (110) configured to supply the output from the power generator (104) to the electric grid (102) and a controller (112) coupled to the converter (110) and configured to disable the converter (110) in response to a grid fault event, to identify the type or the grid fault event after a first predetermined interval from disabling the converter (110), and to enable switching of the converter (110), when the type of the grid fault event is identified as a low voltage condition.

21 Claims, 3 Drawing Sheets

(51) Int. Cl.
  *G01R 31/02* (2006.01)
  *G01R 19/25* (2006.01)
  *H02J 3/38* (2006.01)

(52) U.S. Cl.
  CPC ............ *G01R 19/2513* (2013.01); *H02J 3/38* (2013.01); *Y02E 10/563* (2013.01); *Y02E 10/566* (2013.01); *Y02E 70/30* (2013.01)

(56) References Cited

U.S. PATENT DOCUMENTS

| | | | |
|---|---|---|---|
| 7,332,827 B2 | 2/2008 | Nielsen | |
| 7,622,815 B2 | 11/2009 | Rivas et al. | |
| 7,928,780 B1 | 4/2011 | Yuan et al. | |
| 2006/0171182 A1* | 8/2006 | Siri | H02M 3/33592 363/131 |
| 2007/0159265 A1* | 7/2007 | Weng | G01R 19/2513 331/17 |
| 2009/0284198 A1* | 11/2009 | Shimana | B60L 3/003 318/400.21 |
| 2010/0226051 A1 | 9/2010 | Nair et al. | |
| 2011/0057444 A1 | 3/2011 | Dai et al. | |
| 2011/0101927 A1 | 5/2011 | Drobnjak et al. | |
| 2011/0156388 A1* | 6/2011 | Yasugi | F03D 7/0272 290/44 |
| 2011/0234009 A1 | 9/2011 | Astrom | |
| 2012/0087048 A1* | 4/2012 | Yin | H02J 3/383 361/18 |
| 2013/0058139 A1* | 3/2013 | Bae | H02H 3/38 363/55 |

OTHER PUBLICATIONS

Yamaguchi et al., "Development of a New Utility Connected Photovoltaic Inverter Line Back", Proceedings of The International Telecommunications Conference (INTELEC), Oct. 30-Nov. 3, 1994, pp. 676-682, vol. Conf 16, Vancouver.

European Search Report and Written Opinion issued in connection with corresponding EP Application No. 11874527.2 dated Aug. 10, 2015.

* cited by examiner

SYSTEMS AND METHODS FOR USE IN IDENTIFYING AND RESPONDING TO TYPE OF GRID FAULT EVENT

CROSS REFERENCE TO RELATED APPLICATIONS

This application claims benefit of PCT Patent Application No. PCT/CN2011/081499 filed Oct. 28, 2011, which is hereby incorporated by reference in its entirety.

BACKGROUND OF THE INVENTION

The subject matter disclosed herein relates generally to systems and methods for use in controlling a converter coupled between a power generator and an electric grid.

Electric grids are known for distribution of electric power. A utility power generator is generally known to provide a substantial amount of power to the electric grid, while independent sources are connected to the electric grid to provide a local grid power and reduced dependence on the utility power generator.

Each of the independent sources is connected to the electric grid through a power conditioner and/or a converter to provide consistent and efficient coupling of the independent source to the electric grid. Under certain conditions, the electric grid may experience one or more grid fault events, such as low voltage, high voltage, zero voltage, phase jumping, etc. Often, electric grid operators require that independent sources connected to the electric grid be sufficiently robust to ride through grid fault events. Under such conditions, power conditioners and/or converters may be required to protect the power generator from one or more overvoltage conditions, while providing the ride through functionality. Several known power conditioners and/or converters, for example, include braking resistors to absorb excessive energy to reduce the potential for overvoltage conditions. Other known methods instantaneously turn OFF switching devices within power conditioners and/or converters during a grid fault event, intending to preempt one or more overvoltage conditions, often resulting in a shutdown and/or restart of the power generator.

BRIEF DESCRIPTION OF THE INVENTION

In one aspect, a power module for use in controlling a converter coupled between a power generator and an electric grid is provided. The power module includes a converter configured to supply an output from a power generator to an electric grid and a controller coupled to the converter, and configured to disable the converter in response to a grid fault event. The converter is also configured to identify the type of grid fault event after a first predetermined interval from disabling the converter, and to enable the converter when the type of the grid fault event is identified as a low voltage condition.

In another aspect, a power system is provided. The power system includes a power generator configured to generate a DC voltage and a power module coupled to the power generator and configured to convert the DC output to an AC output and provide the AC output to an electric grid. The power module includes a converter. The power module is configured to detect a grid fault event based on a parameter associated with the converter, disable the converter in response to the detected grid fault event, identify a type of the grid fault event after a first predetermined interval based on the parameter associated with the converter, and when the type of the grid fault event is identified as a phase jump condition, determine if a phase-lock-loop (PLL) module is locked onto the electric grid after a second predetermined interval.

In yet another aspect, a method for use by a power module in controlling a converter coupled between a power generator and an electric grid is provided. The power module includes a converter and a controller coupled to the converter. The method includes detecting a grid fault event as a function of a parameter associated with the electric grid, disabling the converter based on detection of the grid fault event, and identifying, at the controller, the type of the grid fault event after waiting a first predetermined interval.

DETAILED DESCRIPTION OF THE INVENTION

The embodiments described herein relate to power systems and methods for use in controlling a converter coupled between a power generator and an electric grid. More particularly, the embodiments described herein facilitate identifying a type of grid fault event and/or recovering a power module from the grid fault event.

Figure 1:
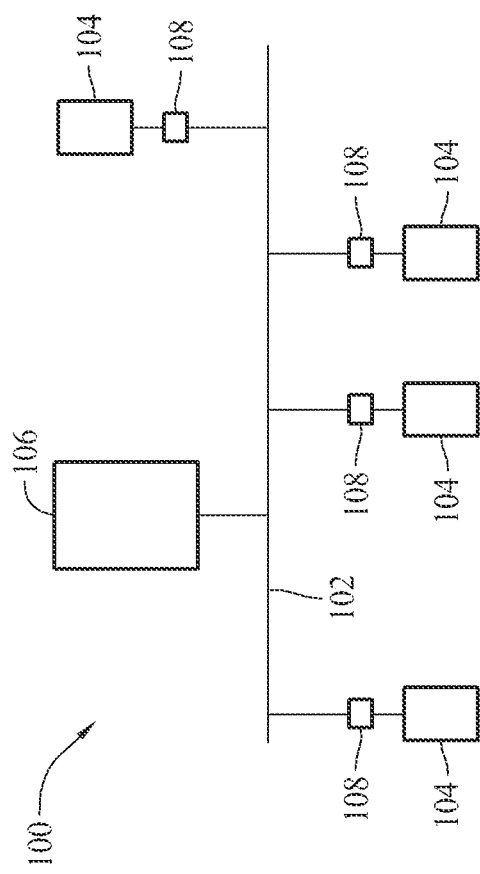
FIG. 1 is a block diagram of an exemplary power system.

FIG. 1 illustrates an exemplary power system 100. In the exemplary embodiment, power system 100 includes an electric grid 102, multiple power generators 104 coupled to electric grid 102, and a major power generator 106 coupled to electric grid 102. Major power generator 106 is configured to provide a relatively major portion of power to electric grid 102, as compared to each individual power generator 104. In various embodiments, each power generator 104 may include, without limitation, one or more photovoltaic (PV) arrays, wind turbines, hydroelectric generators, fuel generators, and/or other power generator devices, etc. Further, major power generator 106 may include, for example, a nuclear, coal, or natural gas power generator. It should be appreciated that power system 100 may include a different number and/or configuration of generators in other embodiments.

In the exemplary embodiment, power system 100 includes a power module 108 coupling each power generator 104 to electric grid 102.

Figure 2:
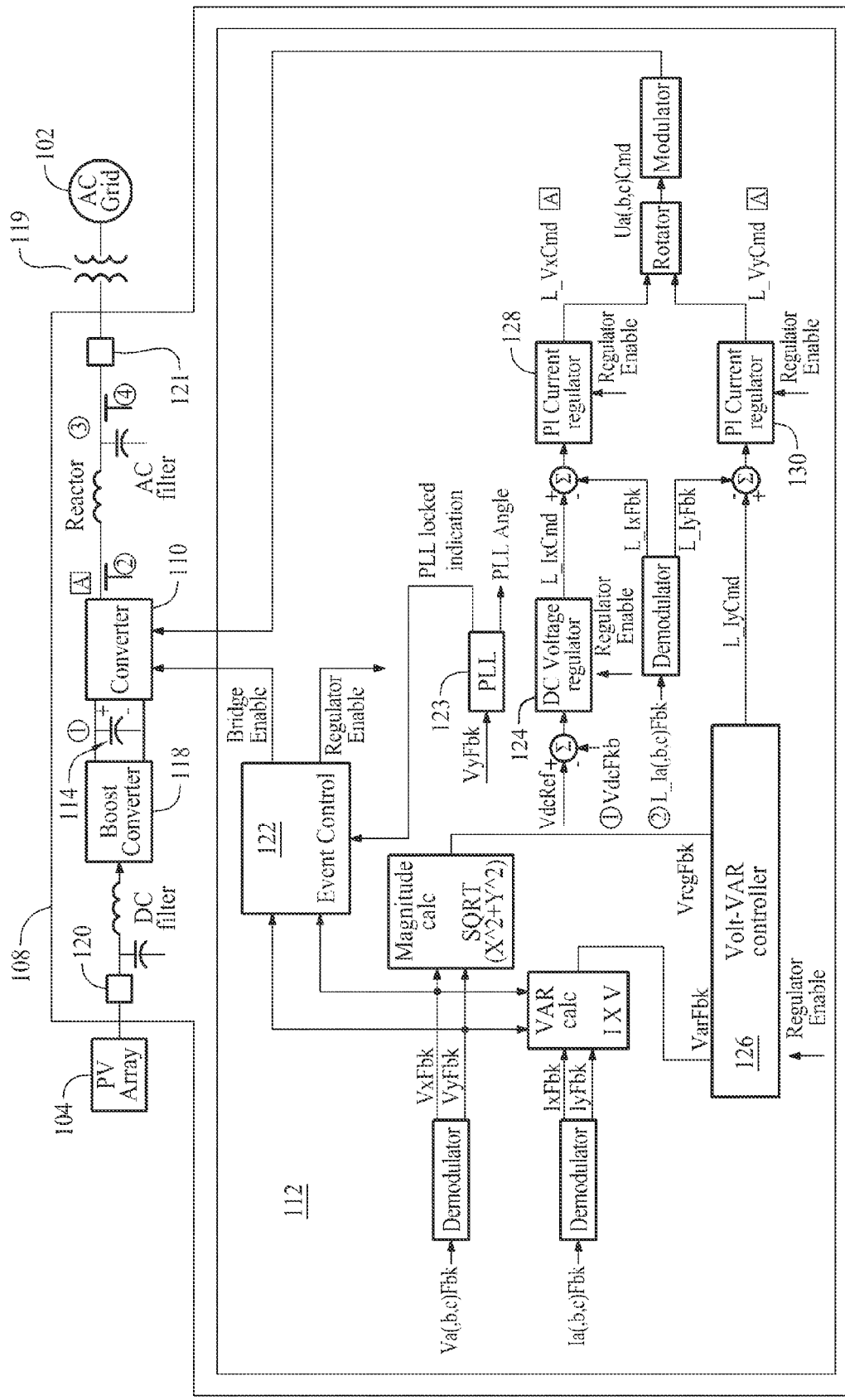
FIG. 2 is a circuit diagram of an exemplary power module that may be used with the power system of FIG. 1.

FIG. 2 illustrates an exemplary power module 108 for use with power system 100. In the exemplary embodiment, power module 108 includes a converter 110 and a controller 112 coupled to converter 110 to provide control signals to converter 110. Converter 110 is a direct current (DC) to alternating current (AC) converter, having a number of switching devices. Control signals to one or more of the switching devices are toggled ON or OFF, to enable or disable converter 112, respectively. In one example, the switching devices include multiple insulated gate bipolar junction transistors (IGBT) configured to provide single or multiple phase outputs from power generator 104 to electric grid 102. Various other switching devices and/or configurations of switching devices may be used in other converter embodiments. It should be further appreciated that other converters may be used in other embodiments. For example, converter 110 may include a DC-DC converter, an AC-DC converter, and/or an AC-AC converter, etc.

As shown in FIG. 2, power module 108 further includes a DC-DC boost converter and an energy storage device 114 coupled between converter 110 and boost converter 118. Specifically, energy storage device 114 is coupled in parallel with an input of converter 110. While energy storage device 114 is illustrated as a single capacitor, it should be understood that a different number and/or type of energy storage device may be used in other embodiments. Additionally, or alternatively, boost converter 118 may include a buck converter, buck-boost converter or other type of converter in other power module embodiments, potentially depending on the power supplied by power generator 104 and/or the power standard of electric grid 102. In at least one embodiment, boost converter 118 is omitted.

In the exemplary embodiment, during operation, DC power is generated by power generator 104, which is transmitted through boost converter 118. Boost converter 118 converts the generated DC voltage from power generator 104 to another DC voltage. The DC voltage from boost converter 118 is supplied to converter 110 and charges energy storage device 114. Converter 110 converts the DC voltage from boost converter 118 to an AC voltage, which is subsequently filtered and provided to electric grid 102 through a transformer 119. Further, power module 108 includes circuit breakers 120 and 121 coupled in series between power generator 104 and electric grid 102. Circuit breaker 120 is configured to de-couple and/or disconnect power generator 104 from power module 108, and circuit breaker 121 is configured to de-couple and/or disconnect electric grid 102 from power module 108.

In the exemplary embodiment, controller 112 provides control signals to converter 110 to provide a desired output voltage to electric grid 102, while reacting to and/or riding through one or more grid fault events of electric grid 102.

In the exemplary embodiment, controller 112 includes an event control 122. As shown in FIG. 2, event control 122 is coupled to a plurality of regulators, which control the switching of one or more switching devices included in converter 110. It should be appreciated that the particular topology of the regulators is merely exemplary and that one or more different topologies may be employed in other power module embodiments. In the exemplary embodiment, controller 112 includes a phase-lock-loop (PLL) module 123, a DC voltage regulator 124, a Volt-VAR regulator 126, current regulators 128 and 130, and a number of other components. Further description of the functionality of such regulators is described below.

Furthermore, in the exemplary embodiment, controller 112 is implemented in software and/or firmware embedded in one or more processing devices. Such processing devices may include, without limitation, a microcontroller, a microprocessor, a programmable gate array, a reduced instruction set circuit (RISC), an application specific integrated circuit (ASIC), etc. Implementations and/or deployment of modules and methods described herein may be efficient and cost effective, and require little or no additional hardware. Further, controller 112 may be programmed for specific applications, such that instructions, predetermined intervals, thresholds, etc. may be programmed and/or stored for particular power generators 104 and/or electric grids 102. While controller 112 is described herein as implemented in one or more processing devices, it should be appreciated that one or more aspects of controller 112 may be implemented by discrete components, external to one or more processing devices.

According to one or more embodiments, technical effects of the methods, systems, and modules described herein include at least one of: (a) detecting a grid fault event as a function of a voltage associated with a converter, (b) disabling the converter based on detection of a grid fault event, and (c) identifying, at a controller, the type of the grid fault event after a first predetermined interval. Furthermore, technical effects of the methods, systems, and modules described herein include at least one of: (a) detecting, by a controller, a grid fault event as a function of a voltage associated with a converter, (b) disabling the converter substantially during the grid fault event, while maintaining coupling between a power generator and an electric grid, and, (c) after the grid fault event, re-enabling the converter to provide an AC voltage to the electric grid.

Figure 3:
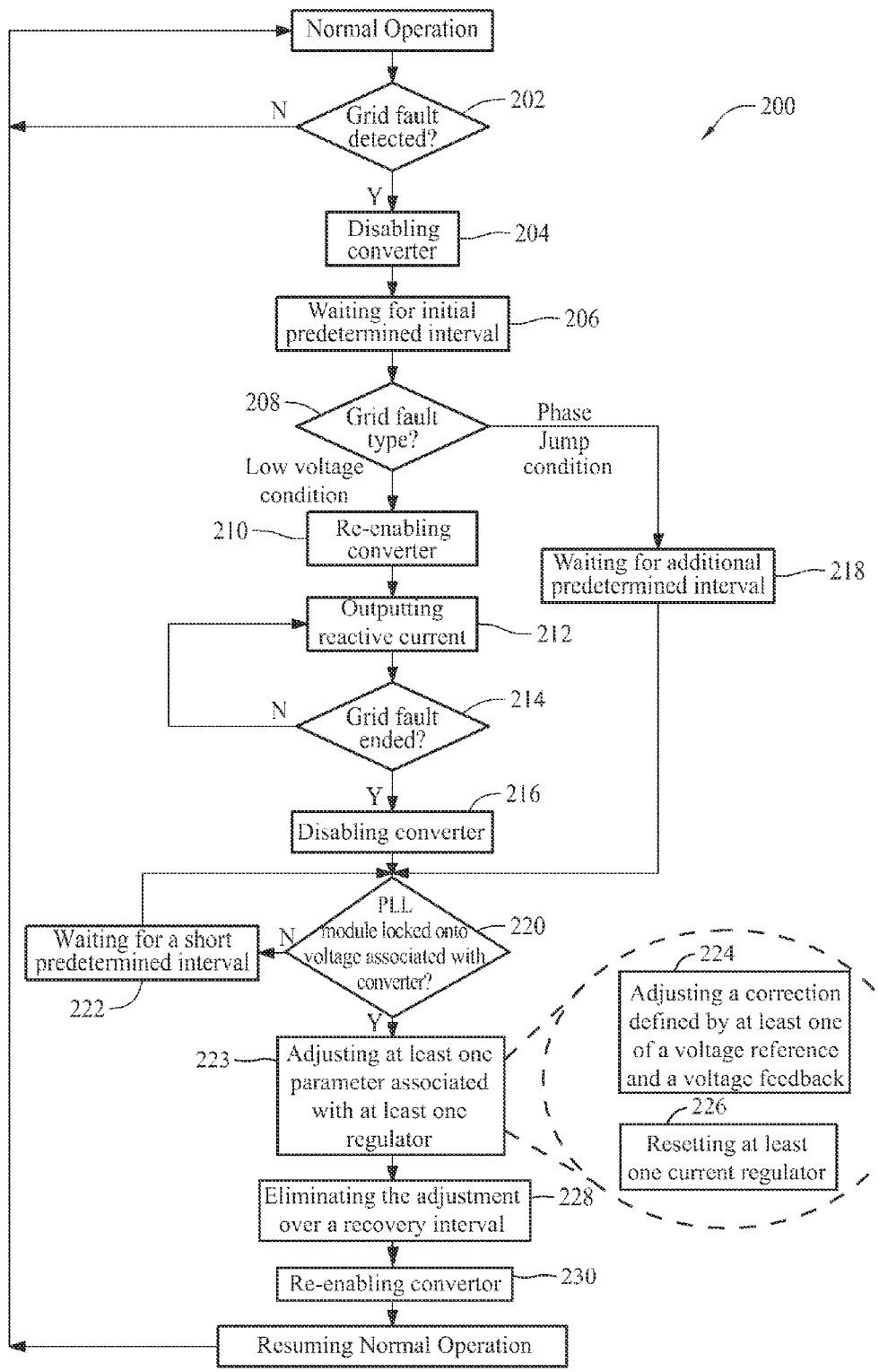
FIG. 3 is a flow diagram of an exemplary method for use in controlling a converter coupled between a power generator and an electric grid.

FIG. 3 illustrates an exemplary method for use in controlling converter 110 during one or more grid fault events. Grid fault events include, without limitation, a low voltage condition, a high voltage condition, a phase jump condition, etc. The term "low voltage condition" refers to an event in which the voltage of at least one phase of the electric grid is lower than a nominal voltage of the electric grid (e.g., about 70-85% or nominal, or lower). As such, the term "low voltage condition" is applicable to zero voltage in at least one phase of the electric grid. The term "phase jump condition" refers to an event in which the phase angle of at least one phase of the electric grid diverges, for example, by about 30° or more from a nominal phase angle of the one or more phases of the electric grid. The term "high voltage condition" refers to an event in which the voltage of at least one phase of the electric grid is substantially exceeds than a nominal voltage of the electric grid. Such conditions may occur during a startup of the converter, during a shutdown of the converter, and/or during any other suitable event. The events may result from, for example, significant switching activity on electric grid 102, closing of one or more capacitive banks, etc. Grid fault events may cause energy storage device 114 to experience an overvoltage condition, potentially causing damage to energy storage device 114 and/or associated components of power module 108.

In response to one or more grid fault events, controller 112 may trip, causing power module 108 and/or power generator 104 to be shutdown. As used herein, the term "trip" refers to one or more conditions in which power generator 104 is disconnected and/or decoupled from electric grid 102 when the voltage at the energy storage device 114 exceeds a predetermined threshold. Trips may include hard trips or soft trips. More specifically, power module 108 invokes a hard trip when the voltage at the energy storage device 114 exceeds, for example, about 1050 to about 1100 VDC, and invokes a soft trip when the voltage exceeds, for example, about 950 VDC. When controller 112 trips, controller 112 disables converter 110 and boost converter 118, and then disconnects and/or decouples power generator 104 from electric grid 102 (e.g., opening circuit breakers 120 and 121, etc.). Subsequently, controller 112 discharges energy storage device 114 to below a threshold level, such as, for example, about 50 VDC. Discharging of energy storage device 114 often occurs over a duration of about 3 minutes to about 25 minutes or more, depending on the voltage across energy storage device 114 and/or the manner in which energy storage device 114 is discharged. During a trip, power generator 104 is unable provide power to electric grid 102.

When the trip is a hard trip, power module 108 remains shutdown until service is provided based on the assumption that the excessive voltage caused component damage. Conversely, when the trip is a soft trip, controller 112 initiates restart of power modules 108 after a wait interval, such as, for example, about 2.0 to about 8.0 minutes, about 3.0 minutes to about 4.0 minutes, or another suitable interval, etc. During restart, controller 112 couples and/or connects power module 108 to electric grid 102 (e.g., via circuit breaker 121), and enables the operation of the regulators and PLL module 123 included therein. Subsequently, power generator 104 is connected and/or coupled to power modules 108 (e.g., via circuit breaker 120), and boost converter 118 is initialized. Boost converter 118 is stepped upward a nominal operating voltage, with converter 110 reacting to each of the steps from initialization until the nominal operating voltage. The restart permits power generator 104 to eventually provide power to electric grid 102, but only after a significant trip/restart interval, often in excess of about 30-40 minutes. In response to grid fault events, conventional power conditioners are known to trip in some instance and maintain operation in other instances. When conventional power conditioners maintain operation, a converter included therein remains enabled which may permit over voltage conditions at a DC bus and/or reverse current into the power conditioners. Such condition stress and/or damage associated components, thereby diminishing the lifetime of the components.

Systems and methods described herein provide one or more processes for avoiding a trip and/or restart of power module 108, while inhibiting overvoltage conditions at and/or reverse power flow to energy storage device 114. More specifically, in one exemplary embodiment, controller 112 quickly detects a grid fault event, identifies a type of grid fault event, and responds accordingly. In doing so, controller 112 inhibits substantial reverse current flow from electric grid 102 to energy storages device 114 and/or overvoltage conditions at energy storage device 114, while avoiding shutdown and/or restart.

In the exemplary embodiment, controller 112 monitors a voltage associated with converter 110 to detect 202 grid fault events. As shown in FIG. 2, event control 122 measures the voltage associated with electric grid 102 directly at an output of converter 110, as compared to monitoring the voltage at PLL module 123. In this manner, event control 122 is able to substantially instantaneously detect one or more grid fault events, by comparing the measured voltage to one or more previously measured voltages. In contrast, known converters employ PLL feedback loops to detect grid fault events. The PLL feedback loops, however, are too slow to accurately track phase angle when electric grid 102 is attempting to clear the grid fault event. Inability to accurately track phase angles often results in reverse current conditions. By measuring the voltage associated with electric grid 102 directly, controller 112 is able to respond to grid fault events more rapidly to disable converter 110, thereby reducing the potential for reverse current conditions and/or stress on energy storage device 114. It should be appreciated that a voltage associated with electric grid 102 may be measured at one or more other locations within power module 108 and/or at electric grid 102 in other embodiments.

Detection of one or more grid fault events may be further based on different thresholds related to the voltage associated with electric grid 102. In the embodiment illustrated in FIG. 2, controller 112 detects a grid fault event when the magnitude of the voltage is about 30-50% below a nominal value and/or when the phase of the voltage diverges by about 20-30° from a nominal value. It should be understood that one or more different thresholds for detecting grid fault events may be employed in other embodiments.

When controller 112 detects the occurrence of a grid fault event, controller 112 disables 204 converter 110. Specifically, in the exemplary embodiment, controller 112 disables each regulator of controller 112, thereby holding switching devices of converter 110 open (i.e., gating OFF converter 110). When converter 110 is disabled, no output is provided from power generator 104 to electric grid 102. Power generator 104 and electric grid 102, however, remain coupled to one another through power module 108, thereby avoiding a trip. After disabling converter 110, controller 112 waits 206 for an initial predetermined interval. In the exemplary embodiment, the initial predetermined interval is between about 2.0 milliseconds to about 20.0 milliseconds, and/or about 3.0 milliseconds to about 5.0 milliseconds. In other embodiments, the initial predetermined intervals may be of different durations, including, for example, about 1.0 millisecond to about 30.0 milliseconds, or more. During the initial predetermined interval, converter 110 remains disabled. It should be appreciated that while method 200 includes waiting steps, controller 112 may conduct one or more other processes, related or unrelated to control of converter 110, while performing a waiting step. More generally, waiting during an interval used herein should not be understood to limit controller 112 to an idle state.

After the initial predetermined interval, controller 112 identifies 208 the type of grid fault event based on, for example, the voltage associated with electric grid 102. In the exemplary embodiment, because converter 110 is disabled during the initial predetermined interval, the voltage measured at the output of converter 110, for example, is substantially dependent on voltage from electric grid 102, rather than converter 110. As such, controller 112 is permitted to more accurately and/or efficiently perceive the grid fault event originating from electric grid 102, due to the reduced effect of converter 110 on the measured voltage.

In the exemplary embodiment, controller 112 determines, based on the magnitude and/or phase of the voltage, whether the grid fault event is the result of a low voltage condition or a phase jump condition, as described above. Generally, to identify 208 the grid fault event, controller 112 evaluates the magnitude of the voltage to determine if the voltage is still low after the initial predetermined interval, or if the voltage has increased since detection of the grid fault event at 202. If the voltage remains below the nominal value, controller 112 determines the type of grid fault event is a low voltage condition. Conversely, if the voltage is greater than the previously detected voltage, but the phase is different, controller 112 determines the type of grid fault event as a phase jump condition. One or more other conditions may be indicated by the magnitude and/or phase of the voltage associated with electric grid 102, such as a high voltage condition in other embodiments. In at least one embodiment, once identified, the types of the grid fault events are stored in controller 112 for one or more diagnostic purposes.

Further, by identifying the type of grid fault event, controller 112 is able to control converter 110 based on the particular type of grid fault event. In various embodiments, rapid identification of the type of grid fault event permits power modules 108 to respond more quickly, potentially intervening prior to reverse current conditions and/or overvoltage conditions at energy storage device 114. In the example of FIG. 3, after the initial predetermined interval (e.g., about 4.0 milliseconds), the type of grid fault event is identified, and controller 112 is able to respond to the grid fault event within about 5.0 milliseconds to about 30 milliseconds, or about 10.0 to about 20.0 milliseconds, of the occurrence of the grid fault event.

By responding in this manner, controller 112 intervenes before recoverable grid fault events cause a reverse current and/or overvoltage condition, leading to a trip of power module 108. Accordingly, power modules 108 described herein are configured to trip to protect power module 108, but ride through an increased number of grid fault events, as compared to known power converters which often rely on slower PLL feedback loops. By reducing the number of trip conditions, controller 112 minimizes shutdown and/or restart of power system 100 and extends the lifetime of components therein, such as energy storage device 114.

In the exemplary embodiment, when controller 112 detects low voltage conditions, controller 112 re-enables 210 converter 110. More specifically, control signals are provided to converter 110 to output 212 reactive current from power generator 104 to electric grid 102. The reactive current is delivered from power generator 104 during the grid fault event. In this manner, power module 108 is configured to remain coupled and/or connected to electric grid 102, while riding through one or more low voltage conditions. Such ride through may be required by the operator of electric grid 102. From outputting 212 reactive current, controller 112 monitors the voltage associated with converter 110 to determine 214 when the grid fault event is ended. After the grid fault event is ended, method 200 includes disabling 216 converter 110 prior to recovering power module 108.

Conversely, if the type of grid fault event is identified as a phase jump condition, method 200 including waiting 218 for an additional predetermined interval. In the exemplary embodiment, the additional predetermined interval is between about 5 milliseconds and about 120 milliseconds (or less than approximately 10 cycles, etc.), and more specifically, between about 10 milliseconds and about 20 milliseconds. In other embodiments, one or more different durations of the additional predetermined interval may be used. After the additional predetermined interval, controller 112 proceeds to recover power module 108.

Subsequently, in the exemplary embodiment, controller 112 re-enables converter 110 to recover power module 108 to normal operation. Controller 112 avoids one or more overvoltage conditions at energy storage device 114, which permits controller 112 to maintain coupling between power generator 104 and electric grid 102. The maintained coupling permits power modules 108 to recover, rather than restart as described above. In this manner, controller 112 is able to re-enable converter 110 and provide an output from power generator 104 to electric grid 102 more rapidly than if a shutdown and/or a restart was required.

In the exemplary embodiment, controller 112 employs PLL module 123 to lock onto the voltage associated with electric grid 102. Specifically, in the exemplary embodiment, method 200 includes determining 220 whether PLL module 123 is locked onto the voltage associated with electric grid 102. When locked, PLL module 123 provides a PLL locked indication to event control 122. Without such an indication, method 200 includes waiting 222 for a short predetermined interval before controller 112 determines 220 again whether PLL module 123 is locked onto the voltage associated with electric grid 102. In one example, the short predetermined interval includes about 5 milliseconds to about 20 milliseconds, or about 8 milliseconds to about 15, or about 10 milliseconds, but may be different in other controller embodiments. Further, in the exemplary embodiment, method 200 alternatively proceeds between determining 220 whether PLL module is locked and waiting 222 for a PLL locked indication, or a timeout interval expires (not shown). The timeout interval is in the range between about 100 milliseconds and about 1.0 second, or about 50 milliseconds and about 2.0 seconds, and may be longer or shorter in still other controller embodiments. When the timeout interval expires, power module 108 and/or converter 110 trip, as described above.

In the exemplary embodiment, when PLL module 123 locks on after a grid fault event, at least one parameter associated with one or more regulators of controller 112 is adjusted to permit converter 110 to recover to normal operation. More generally, after a grid fault event, in which converter 110 is disabled, the voltage at energy storage device 114 may diverge substantially from a nominal value during the grid fault event. Because the voltage across energy storage device 114 controls voltage regulator 124, when converter 110 is enabled, the voltage may immediately demand a substantial power output from power generator 104. Such a demand may cause known power conditioners and/or converters to detect a false grid fault event. Detection of the subsequent false grid fault event may occur repeatedly, effectively preventing known power conditioners and/or converters from recovering from the initial grid fault event. In contrast, after the grid fault event has ended, controller 112 adjusts the parameter associated with the regulator to prevent one or more initial demands from causing detection of a false grid fault event.

In the exemplary embodiment, method 200 proceeds to adjusting 223 at least one parameter associated with at least one of the regulators of controller 112. Specifically, in the exemplary embodiment, method 200 proceeds to adjust 224 a correction defined by at least one of a Vdc reference and a Vdc feedback associated with regulator 124. In this particular exemplary embodiment, the Vdc reference is adjusted to be substantially equal to the Vdc feedback (VdcFbk) from energy storage device 114. In this manner, the correction defined by Vdc reference and Vdc feedback (e.g., a difference between Vdc reference and Vdc feedback), to which voltage regulator 124 responds, is substantially equal to zero. Accordingly, a demand provided from voltage regulator 124 may be insubstantial, as compared to a demand without such an adjustment. In another example, an adjustment may include reducing the correction by summing the Vdc reference, the Vdc feedback and another signal (substantially equal to and opposite of the sum of the Vdc reference and the Vdc feedback) to reduce the total of the three to substantially equal to zero. It should be appreciated that various other adjustments to corrections and/or parameters associated with voltage regulator 124 and/or other regulators of controller 112 may be employed to provide a recovery to converter 110.

Further, before, after or simultaneously with adjusting Vdc reference, a parameter associated with current regulators 128 and 130 may be adjusted. In the exemplary embodiment, method 200 proceeds to reset 226 at least one of current regulators 128 and 130 to make such an adjustment. More specifically, one or more current demands utilized by current regulators 128 and 130 are reset, i.e., zeroed out, prior to enabling converter 110. In one example, current regulators 128 and 130 include integrators (not shown), which determine an integration of current demand over time. Accordingly, the integrators rely on one or more prior current demands. In the exemplary embodiment, controller 112 sets references of current regulators 128 and 130 substantially equal to the prior current demands (stored during operation of current regulators 128 and 130 prior to the grid fault event). As a result, the prior current demands are cancelled out by the new reference, thereby inhibiting current regulators 128 and 130 from acting on current demands from prior to the grid fault event and overshooting a suitable output from current regulators 128 and 130. In several embodiments, one or more parameters associated with current regulators 128 and 130 may be adjusted, after one or more grid fault events, while parameters associated with other regulators within controller 112 remain unadjusted. Further, it should be appreciated that in various other embodiments, one or more parameters associated with one or more different regulators may be adjusted consistent to the description herein.

Moreover, in the exemplary embodiment, method 200 proceeds to eliminate 228 the adjustment over a recovery interval and re-enable 230 converter 110 prior to or after expiration of the recovery interval. The recovery interval provides an interval for returning the adjusted parameter to a value indicated by normal operation of converter 110 and/or the voltage associated with electric grid 102 and/or converter 110. Specifically, in the example above, the adjusted Vdc reference value is permitted to return to a nominal value, over a recovery interval, such as, for example, about 20 milliseconds, about 100 milliseconds, etc. As such, in the exemplary embodiment, controller 112 provides a recovery of converter 110 over time, thereby inhibiting substantial demands after a grid fault event and/or detection of false grid fault events. The recovery interval may be included, without limitation, in the range between about 10 milliseconds and about 1.0 seconds or more, potentially based on topology of controller 112 and/or the bandwidth of one or more regulators included therein.

By responding according to exemplary method 200, in at least one exemplary embodiment, power module 108 is capable of recovering from a grid fault event within about 2.0 seconds, about 5.0 seconds, about 10.0 seconds, or other minor interval, as compared to intervals, often in excess of about 30 to about 40 minutes, involved in restarting power module 108 from a trip condition. In this manner, power module 108 is permitted to deliver more power to electric grid 102, while providing reduced down time and/or stress on one or more components included therein (e.g., energy storage device 114, etc.).

While the systems and methods herein are described with reference to power generators and electric grids, it should be appreciated that such systems and methods may be employed in other applications, such as, for example, motor drive systems, various other PWM converter applications, other power applications, etc.

One more aspects of methods and/or systems described herein may be employed in various combinations. In one or more example systems, the power module is further configured to enable switching of the converter, when the type of grid fault is identified as a low voltage condition, to supply reactive current to the electric grid. Another example system includes a power module including a DC-DC converter coupled between the power generator and the converter. In such an example, the DC-DC converter is configured to boost the DC voltage supplied from the power generator.

In various example methods, the parameter associated with the electric grid includes a voltage associated with the converter. In some example methods, identifying the type of grid fault event includes measuring a magnitude of the voltage associated with the converter. One or more example methods may further include enabling the converter, when the identified type of the grid fault event is a low voltage condition, to supply reactive power to the electric grid. Additionally, or alternately, example methods may include determining if a PLL module of the power module is locked on the voltage associated with the converter after a second predetermined interval, when the identified type of grid fault event is a phase jump condition. Yet another example method may include tripping the power module when the PLL module does not locked onto the voltage associated with the converter after at least about 1.0 second from identifying the type of the grid fault event.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

| PARTS LIST | |
|---|---|
| 100 | Power system |
| 102 | Electric grid |
| 104 | Power generator |
| 106 | Major power generator |
| 108 | Power module |
| 110 | Converter |
| 112 | Controller |
| 114 | Energy storage device |
| 118 | Boost converter |
| 119 | Transformer |
| 120 | Circuit breaker |
| 121 | Circuit breaker |
| 122 | Event control |
| 123 | Phase-lock-loop (PLL) module |
| 124 | Voltage regulator |
| 126 | Volt-VAR regulator |
| 128 | Current regulator |
| 130 | Current regulator |
| 200 | Method |
| 202 | Detecting |
| 204 | Disabling |
| 206 | Waiting |
| 208 | Grid Fault Type |
| 210 | Re-enabling |
| 212 | Outputting |
| 214 | Grid Fault Ends |
| 216 | Disabling |
| 218 | Waiting |
| 220 | PLL Module Locked |
| 222 | Waiting |
| 223 | Adjusting |
| 224 | Adjusting |
| 226 | Resetting |
| 228 | Eliminating |
| 230 | Re-enabling |

What is claimed is:

1. A power module for use in controlling a converter coupled between a power generator and an electric grid, said power module comprising:
   a converter configured to supply an output from a power generator to an electric grid; and,
   a controller coupled to said converter and configured to:
      disable said converter in response to a grid fault event, such that said converter is gated off;
      identify the type of grid fault event after a first predetermined interval from disabling said converter; and
      enable said entire converter, when the type of the grid fault event is identified as a low voltage condition.

2. The power module of claim 1, wherein said controller is configured to identify the type of the grid fault event based on the voltage associated with the electric grid after the first predetermined interval.

3. The power module of claim 2, wherein said controller is configured to determine if a phase-lock-loop (PLL) module of said controller is locked on the electric grid after a second predetermined interval, when the type of the grid fault event is identified by said controller as a phase jump condition.

4. The power module of claim 3, wherein the second predetermined interval is within the range between about 10 milliseconds and about 120 milliseconds.

5. The power module of claim 1, wherein said controller is configured to enable said converter to output reactive current to the electric grid, when the type of the grid fault event is identified by said controller as a low voltage condition.

6. The power module of claim 1, wherein the first predetermined interval is within the range between about 2 milliseconds and about 20 milliseconds.

7. The power module of claim 1, wherein said controller is configured to detect the grid fault event based on an amplitude and/or a phase frequency of a voltage measured at one of said converter and the electric grid.

8. The power module of claim 1, wherein said power module is configured to trip when the type of the grid fault event is identified as a phase jump condition and the grid fault event persists for at least about 1.0 second after identified as a phase jump condition.

9. A power system comprising:
a power generator configured to generate a DC voltage; and,
a power module coupled to said power generator and configured to convert the DC output to an AC output and provide the AC output to an electric grid, said power module including a converter, said power module is configured to:
detect a grid fault event based on a parameter associated with said converter;
disable said converter in response to the detected grid fault event, such that said converter is gated off;
identify a type of the grid fault event after a first predetermined interval based on the parameter associated with said converter;
when the type of the grid fault event is identified as a phase jump condition, determine if a phase-lock-loop (PLL) module is locked onto the electric grid after a second predetermined interval; and
enable said entire converter, after the second predetermined interval, when the type of the grid fault event is identified as a phase jump condition.

10. The power system of claim 9, wherein the parameter associated with said converter comprises a voltage associated with said converter.

11. The power system of claim 10, wherein said power module is further configured to enable switching of said converter, when the type of grid fault event is identified by said controller as a low voltage condition, to supply reactive current to the electric grid.

12. The power system of claim 9, wherein the power generator comprises at least one photovoltaic array.

13. The power system of claim 9, wherein said power module comprises a DC-DC converter coupled between said power generator and said converter, said DC-DC converter configured to boost the DC voltage supplied from said power generator.

14. A method for use by a power module in controlling a converter coupled between a power generator and an electric grid, the power module including a converter and a controller coupled to the converter, said method comprising:
detecting a grid fault event as a function of a parameter associated with the electric grid;
disabling the converter based on the detected grid fault event, such that the converter is gated off;
identifying, at the controller, the type of the grid fault event after waiting a first predetermined interval; and
enabling said entire converter, when the type of the grid fault event is identified as a low voltage condition.

15. The method of claim 14, wherein the parameter associated with the electric grid comprises a voltage associated with the converter.

16. The method of claim 15, wherein identifying the type of grid fault event includes measuring a magnitude of the voltage associated with the converter.

17. The method of claim 15, further comprising enabling the converter, when the identified type of the grid fault event is a low voltage condition, to supply reactive power to the electric grid.

18. The method of claim 17, wherein the first predetermined interval is within the range between about 2.0 millisecond and about 20.0 milliseconds.

19. The method of claim 15, further comprising determining if a phase-lock-loop (PLL) module of the power module is locked on the voltage associated with the converter after a second predetermined interval, when the identified type of grid fault event is a phase jump condition.

20. The method of claim 19, wherein the second predetermined interval is within the range between about 10 milliseconds and about 120 milliseconds.

21. The method of claim 19, further comprising tripping the power module when the PLL module is not lock onto the voltage associated with the converter after at least about 1.0 second from identifying the type of the grid fault event.

* * * * *